United States Patent [19]
Ryum et al.

[11] Patent Number: 5,459,084
[45] Date of Patent: Oct. 17, 1995

[54] METHOD FOR FABRICATING HETERO-JUNCTION BIPOLAR TRANSISTOR HAVING REDUCED BASE PARASITIC RESISTANCE

[75] Inventors: Byung-Ryul Ryum; Deok-Ho Cho; Tae-Hyeon Han; Soo-Min Lee; Oh-Joon Kwon, all of Daejeon, Rep. of Korea

[73] Assignees: Electronics and Telecommunications Research Institute, Daejeon; Korea Telecommunication Authority, Seoul, both of Rep. of Korea

[21] Appl. No.: 358,533

[22] Filed: Dec. 19, 1994

[51] Int. Cl.⁶ .................................. H01L 21/265
[52] U.S. Cl. .................. 437/31; 437/33; 437/126; 437/128; 437/131; 437/192; 437/196; 437/200; 148/DIG. 10; 148/DIG. 11; 148/DIG. 72; 257/183; 257/191; 257/197
[58] Field of Search .................. 437/31, 33, 200, 437/196, 131, 128, 192, 126; 148/DIG. 10, DIG. 11, DIG. 19, DIG. 72, DIG. 147; 257/183, 191, 197

[56] References Cited

U.S. PATENT DOCUMENTS

| | | | |
|---|---|---|---|
| 5,061,646 | 10/1991 | Sivan et al. | 437/33 |
| 5,234,846 | 8/1993 | Chu et al. | 437/33 |
| 5,266,504 | 11/1993 | Blouse et al. | 437/31 |
| 5,279,976 | 1/1994 | Hayden et al. | 437/31 |
| 5,346,840 | 9/1994 | Fujioka | 148/DIG. 10 |
| 5,356,821 | 10/1994 | Naruse et al. | 437/31 |

FOREIGN PATENT DOCUMENTS 0031425  2/1990  Japan ............................. 437/31

*Primary Examiner*—Olik Chaudhuri
*Assistant Examiner*—Long Pham
*Attorney, Agent, or Firm*—Larson and Taylor

[57] ABSTRACT

Disclosed is a fabrication of a hetero-junction bipolar transistor in which a base parasitic capacitance is fully reduced by using a metallic silicide as a base, comprising the steps of injecting an impurity in a silicon substrate to form a conductive buried collector region; growing a collector epitaxial layer on the buried collector region and forming a field oxide layer; selectively injecting an impurity into the collector epitaxial layer to form a collector sinker; sequentially forming a base layer and an first oxide layer thereon; patterning the first oxide layer to define an extrinsic base region; ion-implanting an impurity in the extrinsic base region using a patterned oxide layer as a mask and removing the patterned oxide layer; depositing a metallic silicide film thereon to form a base electrode thin film; forming a capping oxide layer of about 500 Å thickness only on the base electrode thin film; forming an isolating oxide layer thereon and sequentially and selectively removing the isolating oxide layer, the capping oxide layer, the base electrode thin film and the base layer using a patterned photomask to form a pattern, the isolating oxide layer being provided to electrically isolate base and emitter; forming a side wall oxide layer at both side edges of the pattern; removing a portion of the isolating oxide layer to define an emitter region; forming a passivation layer thereon and selectively removing the passivation layer to form contact holes; and depositing a polysilicon layer doped with impurity ions in the contact holes to form electrodes.

13 Claims, 4 Drawing Sheets

5,459,084

METHOD FOR FABRICATING HETERO-JUNCTION BIPOLAR TRANSISTOR HAVING REDUCED BASE PARASITIC RESISTANCE

BACKGROUND OF THE INVENTION

1. Field of the Invention

The present invention relates to fabrication of a semiconductor device, and more particularly to a method for fabricating a hetero-junction bipolar transistor in which a base parasitic capacitance is fully reduced by using a metallic silicide as a base.

2. Description of the Prior Art

As integration of a semiconductor device is improved higher and a semiconductor device is scaled down in size, the operation speed of such semiconductor device can be improved, but the operation characteristic thereof is restricted. It is because dopants injected into emitter and base of the device are increased. To enhance operation characteristics of a semiconductor device, several types of hetero-junction bipolar transistors have been developed. Typical one of them has a SiGe base which is substituted for a silicon base, and has a characteristic of narrowing in energy band gap and grading dependently upon Ge content of the SiGe base.

Recently, a hetero-junction bipolar transistor, which allows a metallic silicide base such as $TiSi_2$ to be substituted for a polysilicon base, is actively researched so as to reduce a parasitic capacitance of a base region or between emitter and base regions, and therefore enhance performance thereof.

The fabricating method of the prior art hetero-junction bipolar transistor will be described below with reference to FIG. 1.

First, after forming a collector region 2 and a collector sinker 4 electrically isolated by an oxide layer 3 on a silicon substrate 1, a SiGe base layer 9 is formed on the collector region 2 by a selective epitaxy growth. Next, after deposition of an insulating layer 7 thereon, the insulating layer is patterned to define an emitter region. Then, an emitter 9 is formed on the base layer and a side wall 8 is formed at both edges of the emitter 9.

Subsequently, after coating a metal thin film only on an inactive region of the base layer 5, an annealing is performed to form a base electrode thin film 6 composed of a metallic silicide.

Finally, after exposing a portion of the base electrode thin film 6, an interconnection electrode 11 is formed on the exposed portion. As a result, fabrication of the prior art hetero-junction bipolar transistor is completed.

In the prior art bipolar transistor, since the base layer 5 is composed of an intrinsic SiGe film, an emitter injection efficiency is improved. Since the base electrode thin film 6 is composed of a metallic silicide film, a parasitic resistance of the thin film 6, i.e. a parasitic resistance of the metallic silicide itself or a contact resistance between the metallic silicide and the interconnection electrode, can be reduced.

However, since a metallic silicide constituting the base electrode thin film 6 is formed by annealing of the base layer 5 and a metal deposited thereon, there arises the problem that a loss of film thickness of the base layer 5 occurs. Thus, the metallic silicide 6, which is used to reduce a parasitic resistance of the base, becomes thinner. It is well-known in the art that the thinner the base layer becomes, the larger the parasitic resistance of the base layer occurs.

In addition, since a region reacting with a metal to form the metallic silicide is the ultra-thin base layer 5 of about 500 Å in thickness, thickness of the metallic silicide 6 is further limited. For this limitation, surface resistance of the metallic silicide 6 is increased, and therefore reduction of parasitic resistance in the base is seriously restricted by thickens of the metallic silicide film 6.

SUMMARY OF THE INVENTION

It is an object of the present invention to provide a method for fabricating a hetero-junction bipolar transistor in which a metallic silicide film as a base electrode thin film is formed without a loss of thickness of the base electrode thin film so as to reduce a parasitic resistance of a base.

It is another object of the present invention to provide a method for fabricating a hetero-junction bipolar transistor in which change in thickness of a metallic silicide film is determined dependently on property of a bipolar transistor itself, thereby allowing it to be improved in operation characteristics and its fabrication sequence to be simplified.

According to the aspect of the present invention, the method for fabricating a hetero-junction bipolar transistor comprising the steps of injecting an impurity in a silicon substrate to form a conductive buried collector region; growing a collector epitaxial layer on the buried collector region and forming a field oxide layer; selectively injecting an impurity into the collector epitaxial layer to form a collector sinker; sequentially forming a base layer and an first oxide layer thereon; patterning the first oxide layer to define an extrinsic base region; ion-implanting an impurity in the extrinsic base region using a patterned oxide layer as a mask and removing the patterned oxide layer; depositing a metallic silicide film thereon to form a base electrode thin film; forming a capping oxide layer of about 500 Å thickness only on the base electrode thin film; forming an isolating oxide layer thereon and sequentially and selectively removing the isolating oxide layer, the capping oxide layer, the base electrode thin film and the base layer using a patterned photomask to form a pattern, the isolating oxide layer being provided to electrically isolate base and emitter; forming a side wall oxide layer at both side edges of the pattern; removing a portion of the isolating oxide layer to define an emitter region; forming a passivation layer thereon and selectively removing the passivation layer to form contact holes; and depositing a polysilicon layer doped with impurity ions in the contact holes to form electrodes.

In this method, the base layer is composed of a single-layer single crystal SiGe film doped with high concentration of $10^{18}$ cm$^{-3}$ or more.

In this method, the base layer is composed of one of a double-layer SiGe/Si film and a three-layer Si/SiGe/Si film.

In this method, Ge content of the base layer is, linearly changed between bottom and top of the base layer.

In this method, Ge content of the base layer is constant in the range of 3% or less.

In this method, Ge content of the base layer is linearly changed between bottom and top of the base layer in the range of from 30% to 0%.

In this method, Ge content of the base layer is constant between bottom and a predetermined height of the base layer in the range of 30% or less and is linearly changed between the predetermined height and top of the base in the range of 30% to 0%.

In this method, Ge content of the base layer is linearly changed between bottom and a predetermined height of the base layer in the range of 0% to 30% and changed between the predetermined height and top of the base layer in the range of 30% to 0%.

In this method, the step of forming the conductive buried collector region is performed at an energy of 30 KeV, and in dose of $6\times10^{15}$ cm$^{-2}$ or more.

In this method, the step of depositing the metallic silicide film is performed using a hot-pressed composite target of $TiSi_{2-x}$.

In this method, the metallic silicide film is composed of the $TiSi_{2-x}$ and has thickness of from 500 to 4000 Å, whereas x is an integer of from 0 to 9.

In this method, the emitter region is composed of a conductive polysilicon layer having about 2000 Å in thickness.

In this method, the emitter region has a lower layer formed by a selective epitaxy growth and composed of a single crystal silicon doped with an impurity concentration of $10^{18}$ cm$^{-3}$ or less, and an upper layer composed of a polysilicon doped with an impurity concentration of $10^{20}$ cm$^{-3}$ or more.

BRIEF DESCRIPTION OF THE DRAWINGS

This invention may be better understood and its object will become apparent to those skilled in the art by reference to the accompanying drawings as follows:

FIGS. 3A to 3H and 3F1 are cross-sectional views showing the steps of a fabricating method of the hetero-junction bipolar transistor according to the present invention.

DESCRIPTION OF THE PREFERRED EMBODIMENT(S)

Figure 2:
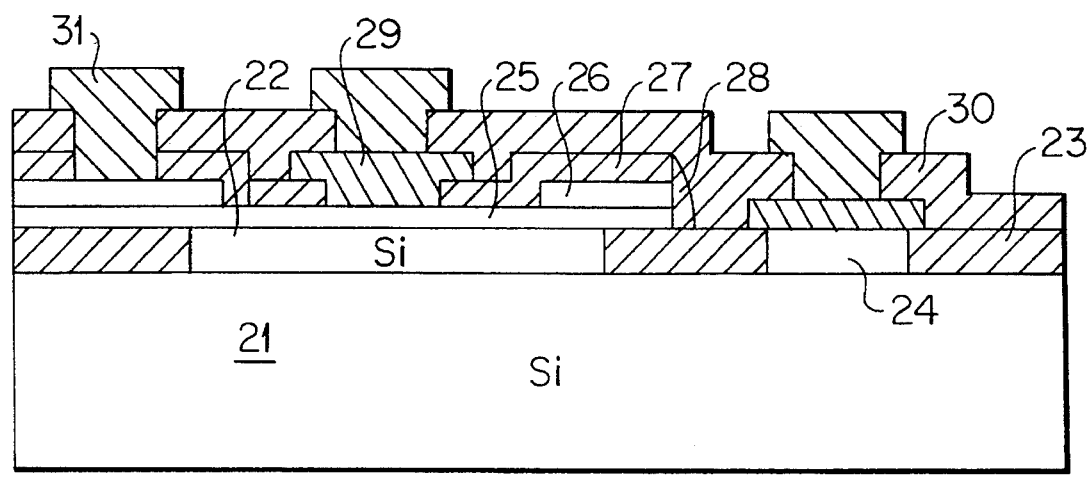
FIG. 2 is a cross-sectional view showing the construction of the hetero-junction bipolar transistor which is fabricated by the fabricating method of the present invention.

Referring to FIG. 2, the hetero-junction bipolar transistor fabricated by the method of the present invention has a buried collector layer 21 on a substrate, a collector epitaxial layer 22 formed on the buried collector layer 21, a collector sinker 24 formed on the buried collector layer 21 and electrically insulated with the collector epitaxial layer 22 by a device isolating oxide layer 23, a base layer 25 formed over the collector epitaxial layer 22, a metallic silicide layer 26 formed on the base layer 25, an oxide layer 27 formed around the metallic silicide layer 26, for selectively injecting an impurity into the base layer 25, and an emitter layer 29 formed on the base layer through an opening in the oxide layer 27.

In the hetero-junction bipolar transistor, since the metallic silicide film 26 can be formed without performing an annealing process, it is possible to simplify its fabrication sequence. The metallic silicide film 26 also can be variably formed in the range of from 500 to 4000 Å in thickness, thereby making it possible to reduce a parasitic resistance of a base.

Hereinafter, the fabricating method of a bipolar transistor according to the present invention will be described in detail with reference to FIGS. 3A to 3H. Component elements having similar functions to the component elements of the hetero-junction bipolar transistor shown in FIG. 2 are indicated by the same reference numerals.

Figure 3A:
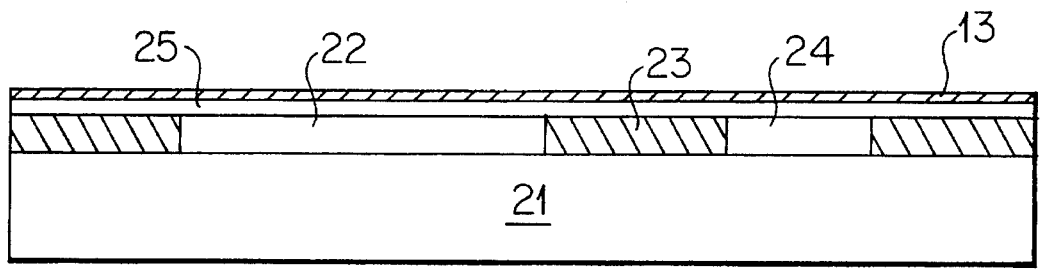

As shown in FIG. 3A, an impurity of high concentration is injected in a silicon substrate (not shown) by ion-implantation to form a conductive buried collector region 21. Next, on the buried collector region 21, a collector epitaxial layer 22 doped with an impurity by in-situ is grown, and then after defining active and inactive regions a field oxide layer 2 is formed. Also, an impurity having high concentration is selectively implanted to form a collector sinker 24. A SiGe base layer 25 and an oxide layer 13 are sequentially formed thereon, as shown in FIG. 3A. In this forming process, the SiGe base layer 25 is formed by an epitaxy such as MBE (molecular beam epitaxy), UHV/CVD (ultra-high vacuum/ chemical vapor deposition) or the like, and the oxide layer 13 of from 500 to 1000 Å in thickness is formed by LPCVD (low pressure chemical vapor deposition) or PECVD (plasma enhanced chemical vapor deposition).

In this embodiment, a single-layer SiGe film is used as the base layer, a double-layer SiGe/Si film or a three-layer Si/SiGe/Si film in addition of the single-layer SiGe film can be used as the conductive base layer 25.

In case that a single-layer SiGe film is used as the base layer 25, an impurity having high concentration of $1\times10^{18}$ cm$_{-3}$ or more is injected therein.

Also, in case that a double-layer Si/SiGe film is used as the base layer 25, an impurity having high concentration of $1\times10^{18}$ cm$_{-3}$ or more is injected only into an upper portion in contact with an emitter. The base layer 25 also can be formed in such a manner that Ge content of the SiGe base layer 25 is linearly controlled in accordance with height of the base layer 25.

For example, the SiGe base 25 can be formed in such a manner that Ge content is constant in the range of 30% or less, or the Ge content may be linearly changed from 30% up to 0% between the bottom and top of the SiGe base. Also, the SiGe base can be formed in such a manner that Ge content thereof is constant between the bottom of the base and a predetermined height in the range of 30% or less and is linearly changed between the predetermined height and the top of the base in the range of from 30% to 0%, or Ge content thereof is linearly increasingly changed between the bottom thereof and a predetermined height in the range of from 0% to 30% and decreasingly changed between the predetermined height and the top thereof in the range of from 30% to 0%. Herein, the term "linearly" means that Ge content of the base is increasingly or decreasingly changed.

Figure 3B:
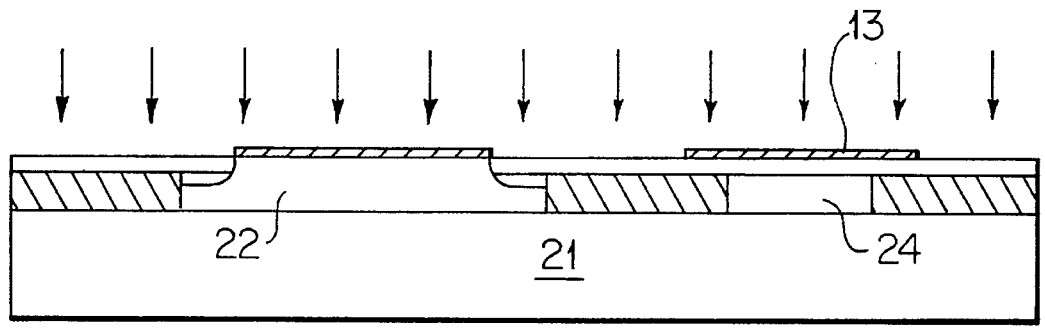

As shown in FIG. 3B, the oxide layer 13 is patterned to define an extrinsic base region, and then ion-implantation is performed using the patterned oxide layer 13 as a mask under the condition of 30 KeV, and dose of $6\times10^{15}$ cm$^{-2}$ to form the extrinsic base region. Also, the patterned oxide layer 19 is removed. During the ion-implantation, impurity ions of high-concentration are injected only into the extrinsic base region of the base layer 25.

Figure 3C:
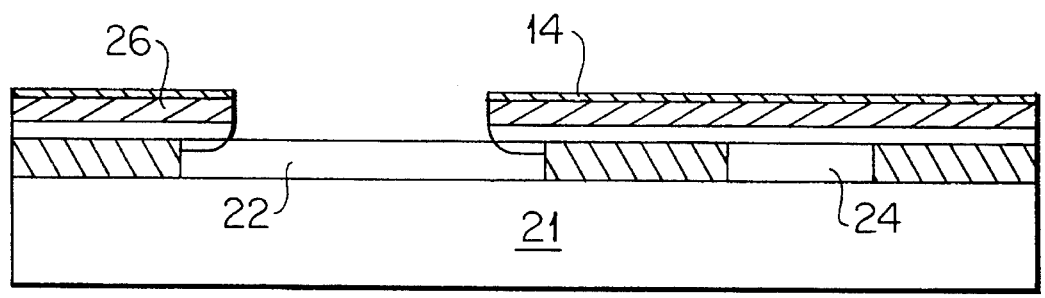

In FIG. 3C, a metallic silicide film 26 is deposited by sputtering to form a base electrode thin film. The formation of the base electrode thin film is performed using an alloy compound source.

For instance, using a hot-pressured composite target of $TiSi_{2-x}$ (whereas, x is an integer of from 0 to 9), an amorphous $TiSi_{2-x}$ (whereas, x is an integer of from 0 to 9) 26 is deposited thereon. Since the base electrode thin film 26 is composed of a metallic silicide film having high conductivity and having from 500 to 4000 Å in thickness, it allows a parasitic resistance of the base layer 25 to be reduced. Also, on the base electrode thin film 26, a capping oxide layer 14 of about 500 Å thickness is formed by the LPCVD.

Figure 3D:
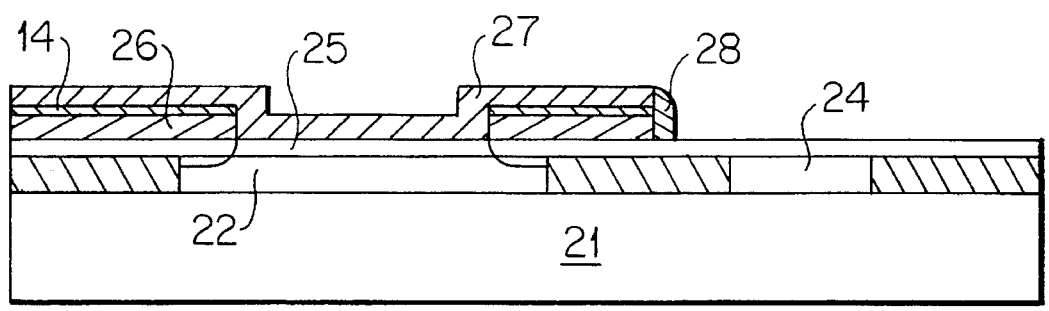

As shown in FIG. 3D, an isolating oxide layer 27 of from 2000 to 4000 Å in thickness is deposited thereon, and then several layers, i.e. the isolating oxide layer 27, the capping oxide layer 14, the base electrode thin film 25 and the base layer 25, are sequentially removed using a patterned photomask (not shown) to form a pattern. Next, at both side edges of the pattern, a side wall oxide layer 28. The isolating oxide layer 27 is provided to electrically isolate the emitter and the base.

Figure 3E:
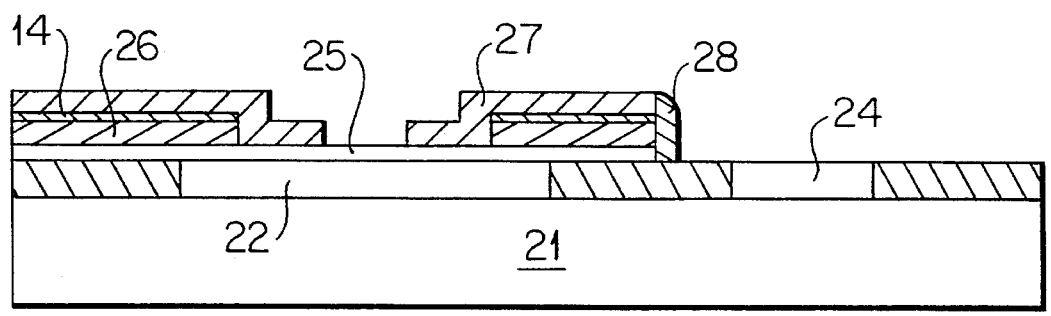

In addition, as shown in FIG. 3E, a portion of the isolating oxide layer 27 is removed to define an emitter region. On the base layer 25, a polysilicon layer doped with As ions is deposited by LPCVD at the temperature of about 650° C. and then patterned to form an emitter layer 29, as shown FIG. 3F. The emitter layer 29 has about 2000 Å in thickness.

Figure 1:
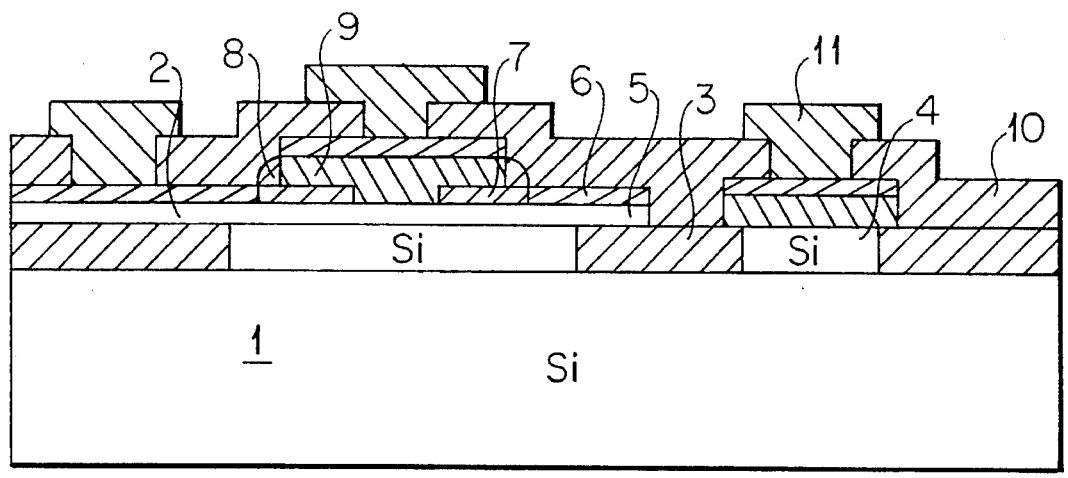
FIG. 1 is a cross-sectional view showing a typical construction of a prior art hetero-junction bipolar transistor.
Figure 3F:
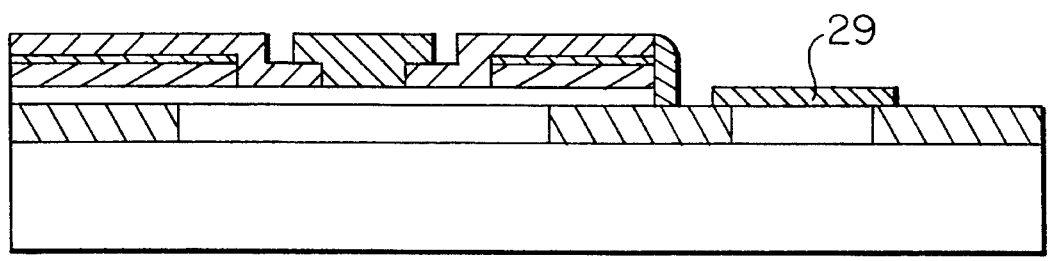
Figures 1, 3F:
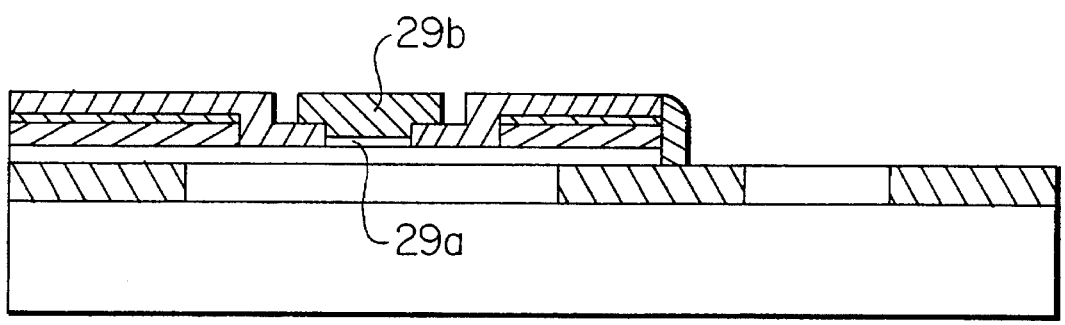

The emitter layer 29, as shown in FIG. 3F-1, has a lower layer 29a formed by a selective epitaxy growth and composed of a single crystal silicon doped with an impurity concentration of $10^{18}$ cm$^{-3}$ or less, and an upper layer 29b composed of a polysilicon doped with an impurity concentration of $10^{20}$ cm$^{-3}$ or more.

Figure 3G:
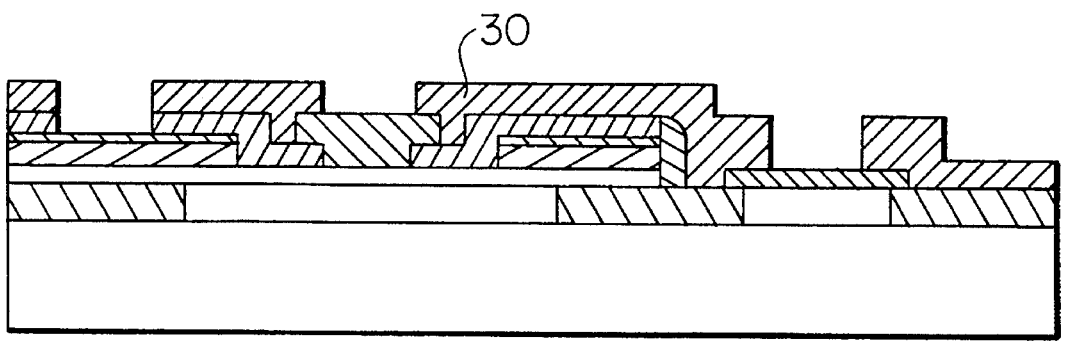
Figure 3H:
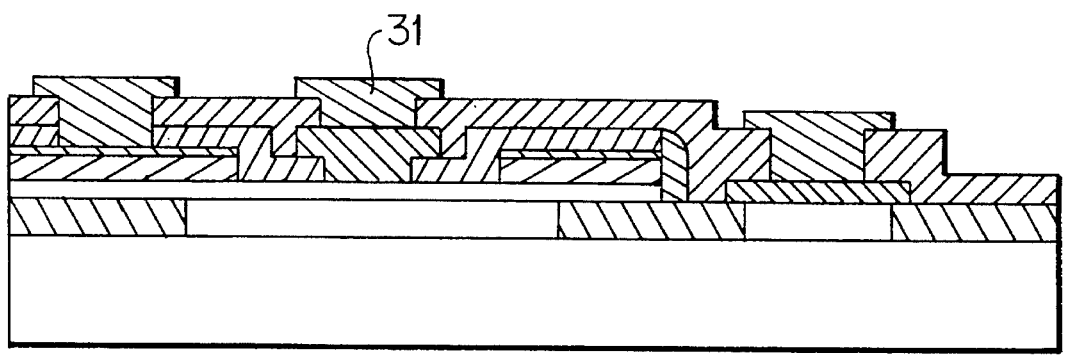

With reference to FIGS. 3G and 3H, after formation of a passivation layer 30 thereon, contact holes are formed by selective removal of the passivation layer 30. Then, electrodes 31 are formed through the contact holes, and therefore fabrication of the hetero-junction bipolar transistor is completed.

As described above, in the fabrication of a hetero-junction bipolar transistor according to the present invention, because a metallic silicide film as a base electrode thin film can be formed without performing an annealing process, it is possible to simplify its fabrication sequence and therefore enhance a yield of production.

Furthermore, because thickness of the metallic silicide film can be variably formed in the range of from 500 to 4000 Å, it is possible to reduce a parasitic resistance of a base.

In addition, in case the hetero-junction bipolar transistor fabricated according to the present invention is embodied in a high-frequency device, it is possible to enhance operation characteristics thereof.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for fabricating a hetero-junction bipolar transistor comprising the steps of:

injecting an impurity in a silicon substrate to form a conductive buried collector region;

growing a collector epitaxial layer on the buried collector region and forming a field oxide layer;

selectively injecting an impurity into the collector epitaxial layer to form a collector sinker;

sequentially forming a base layer and a first oxide layer thereon;

patterning the first oxide layer to define an extrinsic base region;

ion-implanting an impurity in the extrinsic base region using a patterned oxide layer as a mask and removing the patterned oxide layer;

depositing a metallic silicide film thereon to form a base electrode thin film;

forming a capping oxide layer of about 500 Å thickness only on the base electrode thin film;

forming an isolating oxide layer thereon and sequentially and selectively removing the isolating oxide layer, the capping oxide layer, the base electrode thin film and the base layer using a patterned photomask to form a pattern, the isolating oxide layer being provided to electrically isolate base and emitter;

forming a side wall oxide layer at both side edges of the pattern;

removing a portion of the isolating oxide layer to define an emitter region;

forming a passivation layer thereon and selectively removing the passivation layer to form contact holes; and depositing a polysilicon layer doped with impurity ions in the contact holes to form electrodes.

2. The method as defined in claim 1, wherein the base layer is comprised of a single-layer single crystal SiGe film doped with high concentration of $10^{18}$ cm$^{-3}$ or more.

3. The method as defined in claim 1, wherein the base layer is comprised of one of a double-layer SiGe/Si film and a three-layer Si/SiGe/Si film.

4. The method as defined in claim 1, wherein Ge content of at least a portion of the base layer is linearly changed between bottom and top of the base layer.

5. The method as defined in claim 4, wherein Ge content of at least a portion of the base layer is constant in the range of 3% or less.

6. The method as defined in claim 4, wherein Ge content of the base layer is linearly changed between bottom and top of the base layer in the range of from 30% to 0%.

7. The method as defined in claim 4, wherein Ge content of the base layer is constant between bottom and a predetermined height of the base layer in the range of 30% or less and is linearly changed between the predetermined height and top of the base in the range of 30% to 0%.

8. The method as defined in claim 4, wherein Ge content of the base layer is linearly changed between bottom and a predetermined height of the base layer in the range of 0% to 30% and changed between the predetermined height and top of the base layer in the range of 30% to 0%.

9. The method as defined in claim 1, wherein the step of forming the conductive buried collector region is performed at an energy of 30 KeV, and in dose of $6\times10^{15}$ cm$^{-2}$ or more.

10. The method as defined in claim 1, wherein the step of depositing the metallic silicide film is performed using a hot-pressed composite target of TiSi$_{2-x}$.

11. The method as defined in claim 10, wherein the metallic silicide film is comprised of the TiSi$_{2-x}$ and has thickness of from 500 to 4000 Å, whereas x is an integer of from 0 to 9.

12. The method as defined in claim 1, wherein the emitter region is comprised of a conductive polysilicon layer having about 2000 Å in thickness.

13. The method as defined in claim 1, wherein the emitter region has a lower layer formed by a selective epitaxy growth and comprised of a single crystal silicon doped with an impurity concentration of $10^{18}$ cm$^{-3}$ or less, and an upper layer comprised of a polysilicon doped with an impurity concentration of $10^{20}$ cm$^{-3}$ or more.

* * * * *